(12) United States Patent
Yang et al.

(10) Patent No.: US 9,941,470 B2
(45) Date of Patent: Apr. 10, 2018

(54) RRAM DEVICE WITH DATA STORAGE LAYER HAVING INCREASED HEIGHT

(71) Applicant: Taiwan Semiconductor Manufacturing Co., Ltd., Hsin-Chu (TW)

(72) Inventors: Jen-Sheng Yang, Keelung (TW); Chih-Yang Chang, Yuanlin Township (TW); Chin-Chieh Yang, New Taipei (TW); Kuo-Chi Tu, Hsin-Chu (TW); Sheng-Hung Shih, Hsinchu (TW); Wen-Ting Chu, Kaohsiung (TW); Yu-Wen Liao, New Taipei (TW); Manish Kumar Singh, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/403,399

(22) Filed: Jan. 11, 2017

(65) Prior Publication Data
US 2017/0207387 A1    Jul. 20, 2017

Related U.S. Application Data

(63) Continuation of application No. 14/995,294, filed on Jan. 14, 2016, now Pat. No. 9,553,265.

(51) Int. Cl.
*H01L 47/00* (2006.01)
*H01L 45/00* (2006.01)
*H01L 27/24* (2006.01)

(52) U.S. Cl.
CPC .......... *H01L 45/1253* (2013.01); *H01L 45/08* (2013.01); *H01L 45/122* (2013.01);
(Continued)

(58) Field of Classification Search
CPC ............ H01L 45/1233; H01L 45/1253; H01L 45/1666; H01L 45/1691
See application file for complete search history.

(56) References Cited

U.S. PATENT DOCUMENTS 8,872,149 B1    10/2014  Hsieh et al.
9,553,265 B1 *   1/2017  Yang ................... H01L 45/1253
(Continued)

OTHER PUBLICATIONS

Notice of Allowance dated Sep. 13, 2016 for U.S. Appl. No. 14/995,294.

*Primary Examiner* — Yosef Gebreyesus
(74) *Attorney, Agent, or Firm* — Eschweiler & Potashnik, LLC

(57) ABSTRACT

The present disclosure relates to an integrated circuit, which includes a semiconductor substrate and an interconnect structure disposed over the semiconductor substrate. The interconnect structure includes a lower metal layer, an intermediate metal layer disposed over the lower metal layer, and an upper metal layer disposed over the intermediate metal layer. An upper surface of the lower metal layer and a lower surface of the intermediate metal layer are spaced vertically apart by a first distance. A resistive random access memory (RRAM) cell is arranged between the lower metal layer and the upper metal layer. The RRAM cell includes a bottom electrode and a top electrode which are separated by a data storage layer having a variable resistance. The data storage layer vertically spans a second distance that is greater than the first distance.

20 Claims, 7 Drawing Sheets

(52) U.S. Cl.
 CPC ........ *H01L 45/146* (2013.01); *H01L 45/1666* (2013.01); *H01L 45/1691* (2013.01); *H01L 27/2436* (2013.01)

(56) References Cited

U.S. PATENT DOCUMENTS

| | | |
|---|---|---|
| 2014/0117301 A1 | 5/2014 | Lim et al. |
| 2014/0166961 A1* | 6/2014 | Liao .................... H01L 45/1253 257/4 |
| 2014/0175366 A1* | 6/2014 | Tu ....................... H01L 45/1253 257/4 |
| 2014/0264222 A1* | 9/2014 | Yang ................. H01L 29/66659 257/2 |
| 2015/0144859 A1 | 5/2015 | Chen et al. |
| 2015/0228893 A1* | 8/2015 | Narayanan .......... H01L 45/1233 257/4 |
| 2016/0359108 A1 | 12/2016 | Majhi et al. |

* cited by examiner

RRAM DEVICE WITH DATA STORAGE LAYER HAVING INCREASED HEIGHT

REFERENCE TO RELATED APPLICATION

This Application is a Continuation of U.S. application Ser. No. 14/995,294 filed on Jan. 14, 2016, the contents of which is hereby incorporated by reference in its entirety.

BACKGROUND

Many modern electronic devices contain electronic memory configured to store data. Electronic memory can be volatile or non-volatile. Volatile memory loses its stored data when power is removed, whereas non-volatile memory retains its stored data even when power is removed. Resistive random access memory (RRAM) is one promising candidate for next generation non-volatile memory due to its simple structure and CMOS logic compatible process technology. An RRAM cell includes a dielectric data storage layer having a variable resistance, which is placed between two electrodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features can be arbitrarily increased or reduced for clarity of discussion.

DETAILED DESCRIPTION

Figure 1:
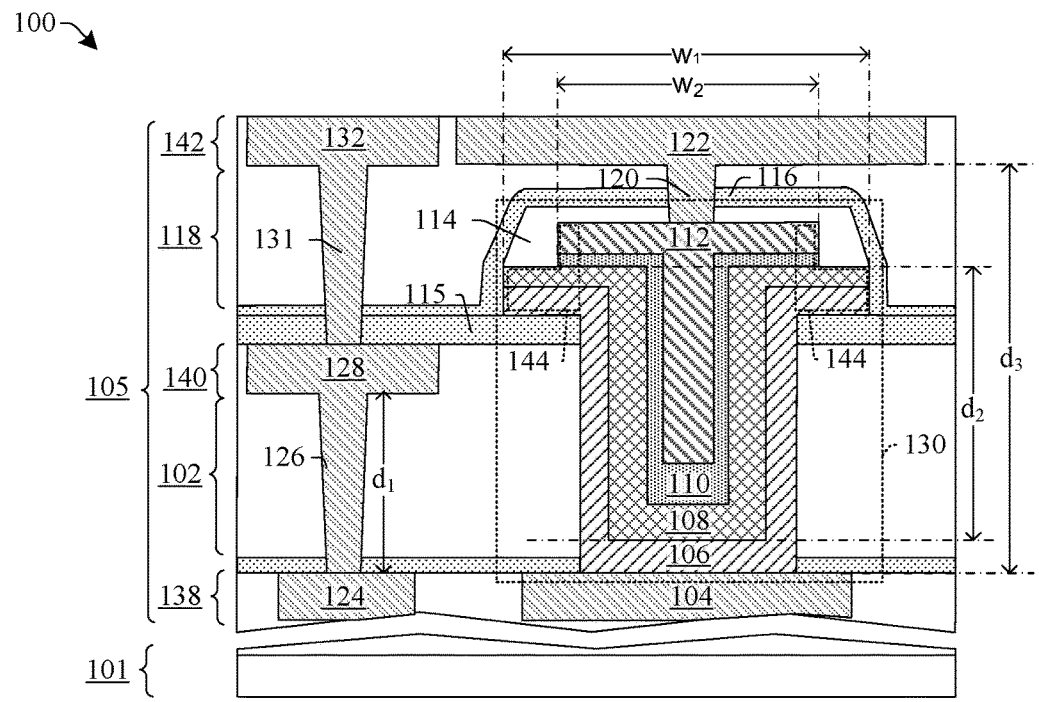
FIG. 1 illustrates a cross-sectional view of some embodiments of an RRAM (resistive random access memory) cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows can include embodiments in which the first and second features are formed in direct contact, and can also include embodiments in which additional features can be formed between the first and second features, such that the first and second features cannot be in direct contact. In addition, the present disclosure can repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

Resistive random access memory (RRAM) has emerged as a promising candidate for next generation electronic data storage due to its simple structure and CMOS logic compatible processes. An RRAM cell, which until now has been confined entirely between two vertically neighboring metal interconnect layers, comprises a conductive bottom electrode separated from a conductive top electrode by a dielectric data storage layer. During operation of the RRAM cell, the data storage layer has a variable resistance that represents a unit of data, such as a bit of data or multiple bits of data. The resistance of the data storage layer is thought to be based on the extent to which oxygen vacancies are present in so-called "filaments" in the data storage layer. For example, to write a first data state to the RRAM cell (e.g., to "set" a logical "1"), a first bias can be applied across the bottom and top electrodes to strip oxygen ions from the filaments in the data storage layer, thereby putting the data storage layer in a low-resistance state. In contrast, to write a second data state to the RRAM cell (e.g., "reset" a logical "0"), a second, different bias can be applied across the bottom and top electrodes to stuff oxygen ions back into the filaments, thereby putting the data storage layer in a high-resistance state. Further, through application of a third bias condition (different from the first and second bias conditions) across the bottom and top electrodes, the resistance of the data storage layer can be measured to determine the stored resistance (i.e., data state) in the RRAM cell.

To manufacture such an RRAM cell, the bottom electrode is formed over a semiconductor substrate, the data storage layer is formed over the bottom electrode, and the top electrode is formed over the data storage layer. The filaments, however, are not initially present during the manufacturing process, and are made at the end of manufacturing by use of a forming process. During the forming process, a so-called "forming voltage" is applied to the RRAM cell to "imprint" the filaments into the cells. Only after the filaments are initially formed by this process can set and reset voltages be used during normal operation of the RRAM cell to change between the high-resistance and low-resistance states.

An appreciation in the present disclosure lies in the fact that as RRAM cell geometries have shrunk for successive technology generations, the forming voltage required to establish the conductive filaments has been correspondingly increasing. This is believed to be due to the reduced area of the data storage layer between the upper and lower conductive electrodes as cell geometries have shrunk over technology nodes. For example, for an RRAM cell with a lateral device area of 200 nm, a forming voltage of approximately 2.2 volts (V) can be sufficient for filament formation. However, when the lateral device area of the RRAM cell is shrunk to 80 nm, a 2.2 V forming voltage is no longer sufficient, and a forming voltage of 2.95 V can be required. As successive technology nodes scale down further, a higher forming voltage would induce more gate oxide stress and becomes a reliability concern.

Accordingly, to reduce forming voltage levels, aspects of the present disclosure increase the area of the data storage layer by increasing the height of the data storage layer. Thus, whereas the data storage layer of other RRAM cells has been vertically confined solely between two adjacent or neighboring metal interconnect layers, the data storage layer of RRAM cells in accordance with the present disclosure has a height that is greater than the spacing between two adjacent metal interconnect layers. This vertical extension of RRAM cells provides the RRAM cells with a greater area for their data storage layer without increasing the lateral area of the RRAM cell, and consequently can maintain the use of a relatively low forming voltage to initially prepare the RRAM cells for use.

FIG. 1 illustrates a cross-sectional view of some embodiments of an integrated circuit 100 including an RRAM cell having an increased height. As shown in FIG. 1, the integrated circuit 100 comprises an interconnect structure 105 disposed over a substrate 101. The interconnect structure 105 comprises a lower metal layer 138, an intermediate metal layer 140 and an upper metal layer 142, which are arranged vertically over one another. Within the interconnect structure 105, the intermediate metal layer 140 is adjacent to each of the lower metal layer 138 and upper metal layer 142. For example, the lower metal layer 138 can be a metal 3 layer, the intermediate metal layer 140 can be a metal 4 layer, and the upper metal layer 142 can be a metal 5 layer. A lower interlayer dielectric (ILD) layer 102 separates the lower metal layer 138 from the intermediate metal layer 140, and an upper ILD layer 118 separates the intermediate metal layer 140 from the upper metal layer 142. An upper surface of the lower metal layer 138 and a lower surface of the intermediate metal layer 140 are spaced vertically apart by a first distance, $d_1$. Other adjacent metal layers can be spaced apart from one another by respective distances, which can be equal or non-equal to $d_1$.

RRAM cell 130 is arranged within the interconnect structure 105 between the lower metal layer 138 and the upper metal layer 142 and comprises a bottom electrode 106 and a top electrode 112. A dielectric data storage layer 108, which has a variable resistance, separates the bottom and top electrodes 106, 112. A capping layer 110, which is configured to store oxygen and help facilitate resistance changes within the data storage layer 108, is disposed between the top electrode 112 and the data storage layer 108. To increase the area of the data storage layer 108, the the data storage layer 108 vertically spans a second distance, $d_2$, that is greater than the first distance $d_1$. Thus, the data storage layer 108 has a height that is greater than the vertical spacing between two adjacent metal interconnect layers (e.g., spacing between lower metal layer 138 and intermediate metal layer 140). This vertical elongation of the data storage layer 108 increases the overall area of the data storage layer 108 without increasing the lateral area of the RRAM cell 130, thereby enabling the use of lower forming voltages compared to other, shorter RRAM cells that have equal lateral areas as this RRAM cell 130.

In some embodiments, the bottom electrode 106, data storage layer 108, and capping layer 110 each have a U-shaped cross-section. The top electrode 112 can have a T-shaped cross-section that matingly engages the U-shaped cross-section of the capping layer 110 and/or data storage layer 108.

One feature that contributes to the increased height of the data storage layer 108 in FIG. 1's embodiment is spacer layer 115. Spacer layer 115 is disposed over the lower ILD layer 102 and over the intermediate metal layer 140. The data storage layer 108 overlies the spacer layer 115. Thus, although the spacer layer 115 may not be present in all implementations, when present, the spacer layer 115 provides for a convenient manner to provide some additional amount of height above upper surface of intermediate metal layer 140 so that upper portions 144 of the lower electrode 106, data storage layer 108, capping layer 110, and top electrode 112 can extend downwardly along inner sidewalls of the spacer layer 115 and over the upper surface of the spacer layer 115 to provide increased height. In some embodiments, the spacer layer 115 is a dielectric layer, and can be made of silicon nitride (Si3N4), silicon oxynitride (SiON), or silicon carbide (SiC) for example.

In FIG. 1's embodiment, the bottom electrode 106 and data storage layer 108 have outermost sidewalls that are aligned with one another. Thus, in the illustrated embodiment, outermost sidewalls of the bottom electrode 106 and data storage layer 108 are spaced apart by a first width, $w_1$. Outermost sidewalls of the capping layer 110 and top electrode 112 are also illustrated as being aligned to one another, and are spaced apart by a second width, $w_2$, which is less than the first width, $w_1$.

A sidewall spacer 114 is disposed on a peripheral region of the data storage layer 108. The sidewall spacer 114 covers outer sidewalls of the capping layer 110 and the top electrode 112, and extends over an upper surface of top electrode 112. In other embodiments, however, the sidewall spacer 114 can have an upper surface aligned with that of the top electrode 112, such that sidewall spacer 114 does not extend over top electrode 112. An upper etch stop layer 116 extends over spacer layer 115, along outer sidewall of bottom electrode 106, along outer sidewall of data storage layer 108, and along outer sidewall and upper surface of sidewall spacer 114. In some embodiments, the spacer layer 115 and the upper etch stop layer 116 can be made of the same dielectric material, such as silicon nitride (Si3N4), silicon oxynitride (SiON) or silicon carbide (SiC).

In FIG. 1's embodiment, the bottom electrode 106 is arranged directly on a lower metal line 104 of the lower metal layer 138. However, in other embodiments, the bottom electrode 106 and metal line 104 can be spaced apart, and a via (not shown) can extend vertically from the lower metal line 104 to the bottom electrode 106 and thereby couple the lower metal line 104 to the bottom electrode 106. The illustrated embodiment (in which the bottom electrode 106 is in direct contact with the lower metal line 104) is advantageous as it tends to allow for a greater height, and thus greater area, for the data storage layer 108 for a given RRAM cell height. Somewhat similarly, in FIG. 1's embodiment, the top electrode 112 is illustrated as being coupled to an upper metal line 122 of the upper metal layer 142 through a conductive via 120. However, in other embodiments, the top electrode 112 can have an upper planar surface that is coupled directly to the upper metal line 122 without a via being present between them.

To provide further examples of how an increased height for the data storage layer 108 can manifest itself, the illustrated interconnect structure 105 includes a lower via 126 within the lower ILD layer 102 to couple a first metal line 124 of the lower metal layer 138 to a second metal line 128 of the intermediate metal layer 140. An upper via 131 is disposed within the upper ILD layer 118 to couple the second metal line 128 of the intermediate metal layer 140 to a third metal line 132 of the upper metal layer 142. The second distance, $d_2$, of the data storage layer 108 can be greater than a height of the lower via 126. The second distance, $d_2$, can also be greater than a height of the upper via 131, which can be the same or greater than the height of the lower via 126.

The various layers of RRAM cell can be made of a variety of materials. For example, in some embodiments, the bottom electrode 106 can be made of a metal or alloy such as tungsten (W), titanium (Ti), tantalum (Ta), copper (Cu), nitrogen, oxide, and combinations thereof, for example. The data storage layer 108 can comprise a high-k dielectric, such as hafnium oxide (HfO$_X$), zirconium oxide (ZrO$_X$), aluminum oxide (AlO$_X$), nickel oxide (NiO$_X$), tantalum oxide (TaO$_X$), or titanium oxide (TiO$_X$), for example. The capping layer 110 can comprise a metal or a metal oxide. In some embodiments, the capping layer 110 can comprise a metal such as titanium (Ti), hafnium (Hf), platinum (Pt), ruthenium (Ru), and/or aluminum (Al). In other embodiments, the capping layer 110 can comprise a metal oxide such as titanium oxide (TiO$_X$), hafnium oxide (HfO$_X$), zirconium oxide (ZrO$_X$), germanium oxide (GeO$_X$), or cesium oxide (CeO$_X$), for example. The top electrode 112 can comprise a metal nitride (e.g., titanium nitride (TiN) or tantalum nitride (TaN)) or a metal (e.g., platinum (Pt), titanium (Ti) or tantalum (Ta)), for example. The top electrode 112 can be made of the same material as the bottom electrode, or can be made of a different material, depending on the implementation.

During operation of the RRAM cell 130, voltages applied to the bottom electrode 106 and the top electrode 112 generate an electric field that extends into the data storage layer 108. The electric field acts upon oxygen vacancies within the data storage layer 108 and/or capping layer 110, inducing conductive paths (e.g., filaments comprising the oxygen vacancies) to form across the data storage layer 108. Depending on the applied voltages, the data storage layer 108 will undergo a reversible change between a high-resistance state associated with a first data state (e.g., a '0') and a low-resistance state associated with a second data state (e.g., a '1').

Thus, FIG. 1 shows an example wherein the height of the data storage layer 108 spans a second vertical distance, $d_2$, which is greater than a first vertical distance, $d_1$, between the lower and intermediate metal layers 138, 140. Although FIG. 1 shows an example where the height of the data storage layer, $d_2$, is greater than spacing $d_1$ and less than a third vertical spacing $d_3$ (wherein $d_3$ is measured from upper surface of lower metal layer 138 to lower surface of upper metal layer 142), in other embodiments, the height of the data storage layer, $d_2$, can be greater than the spacing, $d_3$. For example, although the distances $d_1$, $d_2$, and $d_3$ vary depending on the technology node, in some embodiments of an N40 technology node, $d_1$ can be approximately 70 nm; $d_2$ can be approximately 250 nm; and $d_3$ can be approximately 370 nm. Thus, in other embodiments the height of the data storage layer 108 can span multiple adjacent metal interconnect layers. In these alternative embodiments, the increased height of the data storage layer 108 can further decrease the forming voltage required for manufacturing.

Figure 2:
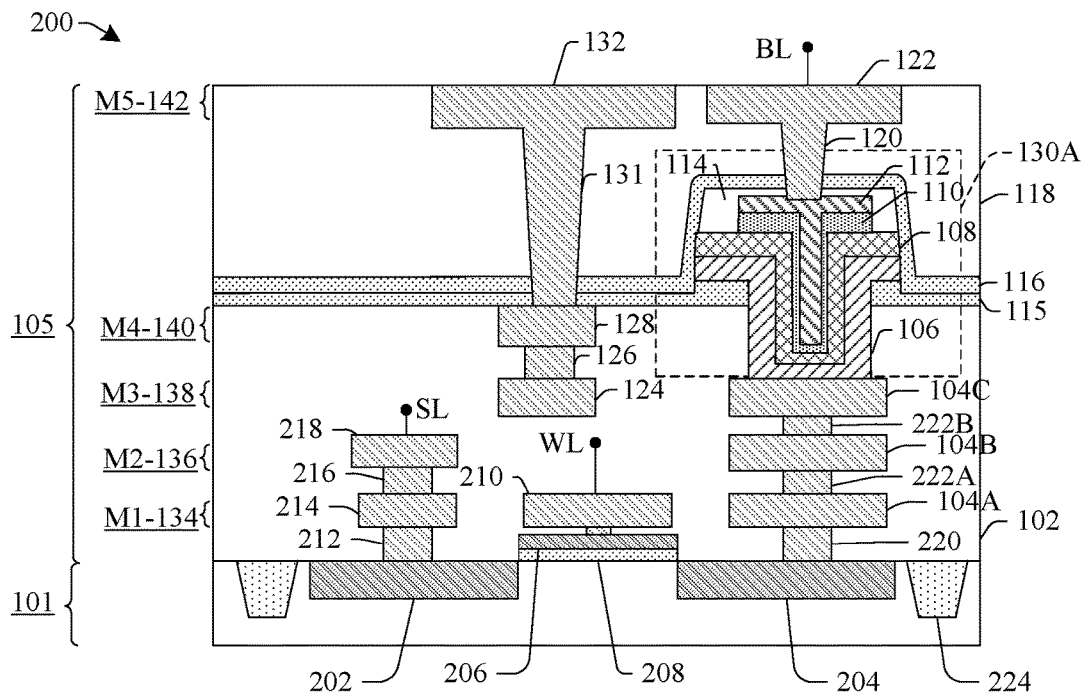
FIG. 2 illustrates a cross-sectional view of some additional embodiments of an RRAM cell.

FIG. 2 illustrates a cross-sectional view of some additional embodiments of an integrated circuit 200 including an RRAM (resistive random access memory) cell 130A with an increased height.

As shown in FIG. 2, an interconnect structure 105 can include a plurality of metal layers or other conductive layers (e.g., metal 1 layer (M1) 134, metal 2 layer (M2) 136, metal 3 layer (M3) 138, metal 4 layer (M4) 140, and metal 5 layer (M5) 142) stacked over one another and disposed over a substrate 101. The metal layers are made up of metal lines, for example M3 138 includes a first metal line 124 and a lower metal line 104C, while M5 142 includes a third metal line 132 and an upper metal line 122. The metal layers can be isolated from one another by a lower ILD layer 102 or an upper ILD layer 118, such as a silicon dioxide or low-k dielectric layer. Metal lines in neighboring metal layers can be coupled by conductive vias. For example, the first metal line 124 and a second metal line 128 can be coupled by a lower via 126, and the second metal line 128 and the third metal line 132 can be coupled by an upper via 131. An RRAM cell 130A is disposed between two metal layers which have one or more intermediate metal layers disposed therebetween. For example, as shown in FIG. 2, the RRAM cell 130A is disposed between M3 138 and M5 142, crossing M4 140. A bottom electrode 106 and a data storage layer 108 are disposed across one or more metal layers (e.g. M4 140). The RRAM cell 130A has a height that is greater than that of the lower via 126 between M3 138 and M4 140. It will be appreciated that the RRAM cell 130A is not limited to be coupled between M3 138 and M5 142, and the RRAM cell 130A can be disposed between any two applicable metal layers separated by one or multiple metal layers. The locations of the lower metal line 104C and the upper metal line 122, respectively, are illustrated as abutting the bottom electrode 106 and top electrode 112, respectively, but can in general abut any lower or upper metal interconnect layers, such that height of the RRAM cell (and corresponding data storage area) is increased.

In some embodiments, the substrate 101 has a transistor arranged between isolation regions 224. The transistor includes a source region 202, a drain region 204, a gate electrode 206, and a gate dielectric 208. A source line 218 (SL) is connected to the source region 202 through a contact plug 212, a first metal interconnect line 214, and a first metal via 216, which are disposed within one or more ILD layers such as the lower ILD layer 102. A word line (WL) 210 for addressing the memory cell is coupled to the gate electrode 206. The bottom electrode 106 of the memory cell is connected to the drain region 204 through contact plug 220, first, second, third, and forth metal interconnect layers 104A-104C, and metal vias 222A-222B. In some embodiments, a conductive via 120 connects the top electrode 112 of the memory cell to a bit line arranged within the fifth metal interconnect layer disposed within the upper ILD layer 118. The data storage layer 108 can comprise a RRAM dielectric layer and a capping layer 110 can be disposed on the RRAM dielectric layer as shown in FIG. 2. The RRAM cell can further comprise a hard mask (not shown) disposed on the top electrode 112 surrounding the conductive via 120 and a sidewall spacer 114 along sidewalls of the top electrode 112. A spacer layer 115 and an upper etch stop layer 116 can be disposed surrounding the RRAM cell 130A, and the upper etch stop layer 116 can abut sidewalls of the bottom electrode 106 and the sidewall spacer 114.

Figure 3:
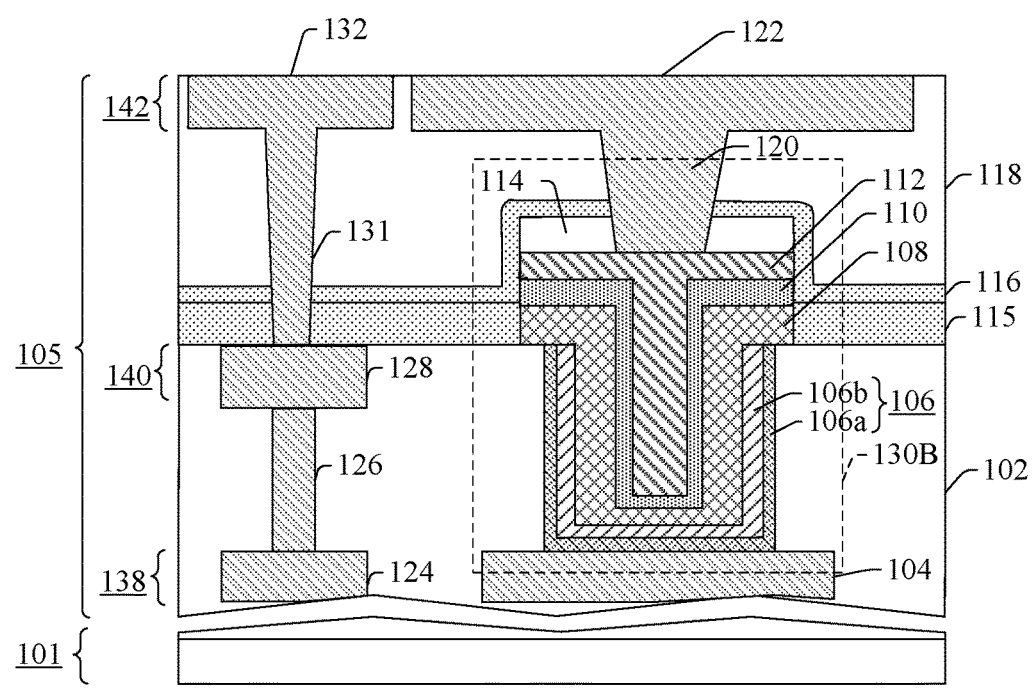
FIG. 3 illustrates a cross-sectional view of some additional embodiments of an RRAM cell.

FIG. 3 illustrates some additional embodiments of an integrated circuit 300 with an RRAM cell 130B where the bottom electrode 106 of the RRAM cell can comprise multiple conductive layers. For example, the illustrated bottom electrode 106 includes a barrier layer 106a, and at least one upper bottom electrode layer 106b disposed over the barrier layer 106a. The barrier layer 106a abuts a lower metal line 104 and prevents the lower metal line 104 from diffusing into the upper bottom electrode layer 106b. In some embodiments, the barrier layer 106a can comprise a conductive oxide, nitride, or oxynitride of a metal such as aluminum (Al), manganese (Mn), cobalt (Co), titanium (Ti), tantalum (Ta), tungsten (W), nickel (Ni), tin (Sn), magnesium (Mg), and combinations thereof. The upper bottom electrode layer 106b can be made of metal or alloy such as tungsten (W), titanium (Ti), tantalum (Ta), copper (Cu) and combinations thereof. For example, in some embodiments, the barrier layer 106a is made of TaN, and the upper bottom electrode layer 106b is made of TiN.

FIGS. 4-11 illustrate some embodiments of cross-sectional views showing a method of forming an RRAM cell in accordance with this disclosure.

Figure 4:
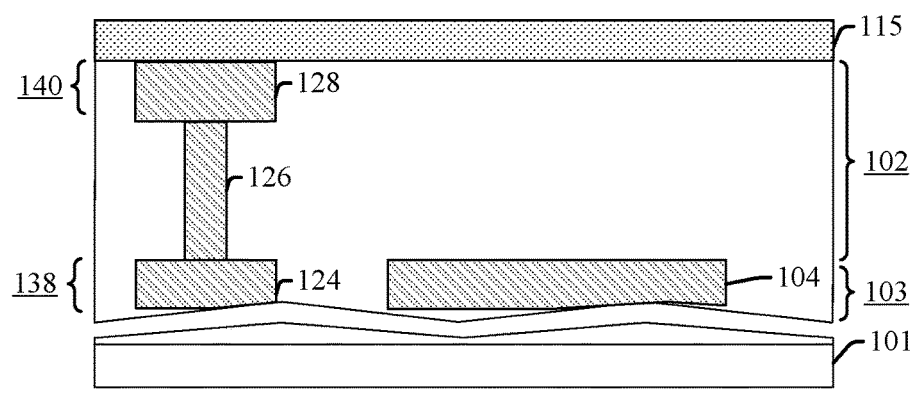
FIGS. 4-11 illustrate some embodiments of cross-sectional views showing a method of forming an RRAM cell.

As shown in cross-sectional view 400 of FIG. 4, an interconnect structure is formed over a substrate 101. In some embodiments, the substrate 101 can be a bulk silicon substrate or a semiconductor-on-insulator (SOI) substrate (e.g., silicon on insulator substrate). The substrate 101 can also be a binary semiconductor substrate (e.g., GaAs), a tertiary semiconductor substrate (e.g., AlGaAs), or a higher order semiconductor substrate, for example. In many instances, the substrate 101 manifests as a semiconductor wafer, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After processing is completed, for example after RRAM cells are formed, such a wafer can optionally be stacked with other wafers or die, and is then singulated into individual die which correspond to individual integrated circuits.

The interconnect structure is formed by forming an inter-layer dielectric (ILD) layer 103 over the substrate 101, and etching trenches and/or via openings in the ILD layer 103. Metal is then formed in the trenches and via openings to establish conductive metal lines 104, 124 and vias 126, and a chemical mechanical planarization (CMP) process is used to remove excess metal and planarize upper surfaces of the metal lines with the surrounding ILD layer 103. Another ILD layer 102 is then formed, additional trenches and via openings are formed in the ILD layer 102, and metal vias 126 and lines 128 are formed in the trenches and via openings. Any number of metal lines and vias can be formed in this manner. In some embodiments, the ILD layer 102 can comprise one or more layers of an oxide, a low-k dielectric, or an ultra-low-k dielectric; and the plurality of metal layers 138, 140 and vias 126 can comprise copper, tungsten, and/or aluminum.

A spacer layer 115, which may also act as a bottom etch stop layer, is subsequently formed on upper surface of the lower ILD layer 102 and/or the intermediate metal layer 140. In some embodiments, the spacer layer 115 can be formed using a vapor deposition technique (e.g., physical vapor deposition, chemical vapor deposition, etc.). The spacer layer 115 can be made of silicon nitride or silicon dioxide, for example.

Figure 5:
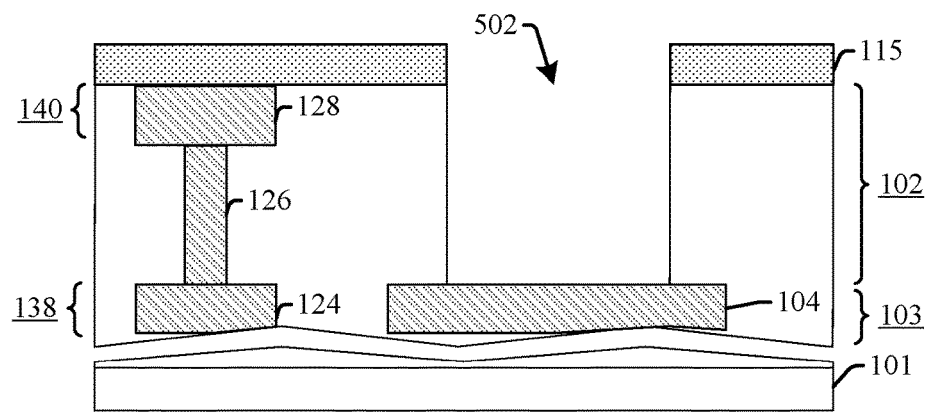

As shown in cross-sectional view 500 of FIG. 5, the spacer layer 115 and the lower ILD layer 102 are selectively etched (e.g., using a dry etchant) to form a deep trench 502 and thereby expose an upper surface of the lower metal line 104. To perform this selective etch, a mask (not shown) is typically formed over the spacer layer 115 by photolithography, for example. The mask can be a photoresist mask, made of photoresist, or a hard mask such as a nitride hardmask, and has an opening corresponding to the location of deep trench 502. The deep trench 502 extends downwardly and has a total depth greater than a height of the lower via 126 and can be etched to cross one or more metal layers and vias such as the intermediate metal layer 140 and the lower via 126.

Figure 6:
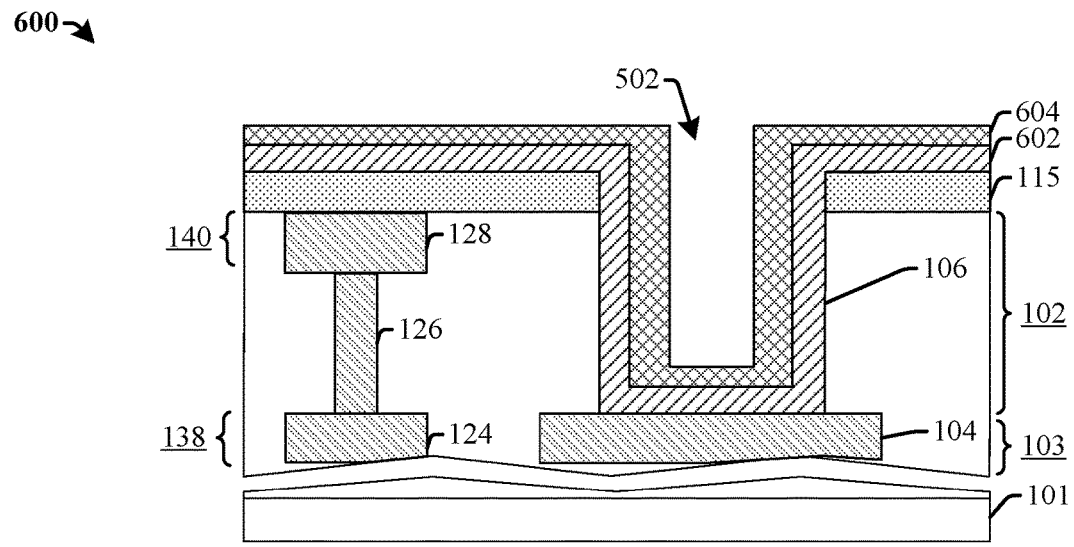

As shown in cross-sectional view 600 of FIG. 6, a bottom electrode layer 602 is conformally formed over an upper surface of the spacer layer 115; and along deep trench sidewalls and over a bottom surface of the deep trench 502. A data storage layer 604 is then formed over the lateral portions of the bottom electrode layer 602, and over portions of the bottom electrode layer 602 in the deep trench 502. In some embodiments, the bottom electrode layer 602 and the data storage layer 604 can be formed using a vapor deposition technique (e.g., ALD, CVD, PE-CVD, etc.). The bottom electrode layer 602 can comprise a conductive material, such as Ti, TiN, Ta, TaN, W, or Cu, for example. The data storage layer 604 can comprise a high-k dielectric layer, such as hafnium oxide ($HfO_X$), zirconium oxide ($ZrO_X$), aluminum oxide ($AlO_X$), nickel oxide ($NiO_X$) tantalum oxide ($TaO_X$), or titanium oxide ($TiO_X$), for example.

Figure 7:
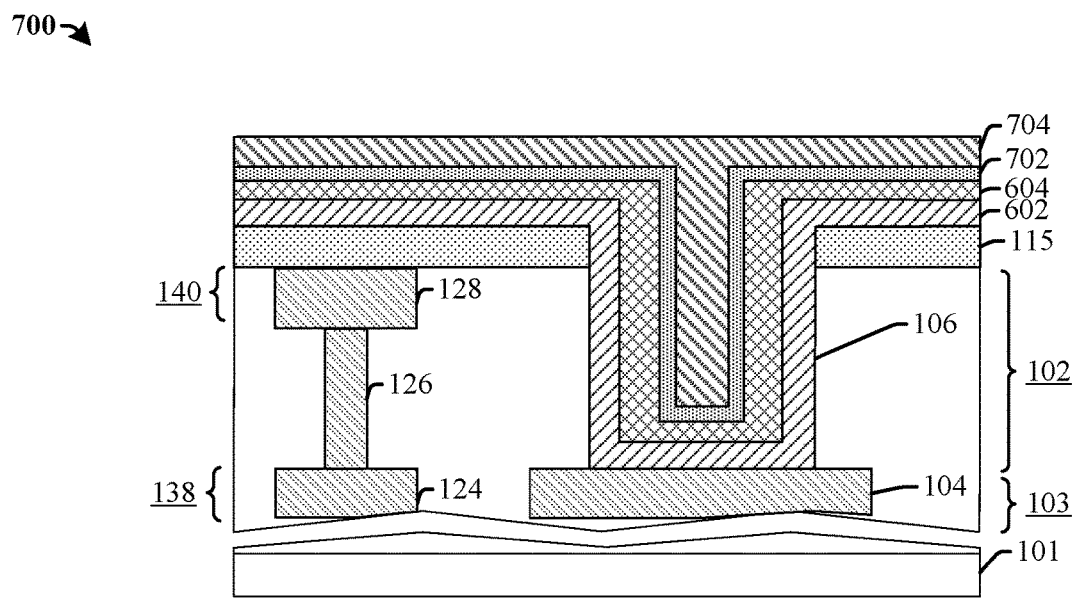

As shown in cross-sectional view 700 of FIG. 7, a conformal capping layer 702 is formed over the data storage layer 604, and a top electrode layer 704 is formed over the data storage layer 604 to fill the remainder of deep trench. In some embodiments, the top electrode layer 704 and the capping layer 702 can be formed using a vapor deposition technique (e.g., ALD, CVD, PE-CVD, etc.). In some embodiments, a planarization process, such as a CMP process, is performed to form a planar upper surface for the top electrode layer 704. In some embodiments, the top electrode layer 704 can comprise a conductive material, such as Ti, TiN, Ta, TaN, W, or Cu, for example. In some embodiments, the capping layer 702 can comprise a metal such as titanium (Ti), hafnium (Hf), platinum (Pt), ruthenium (Ru), and/or aluminum (Al). In some embodiments, the capping layer 702 can comprise a metal oxide such as titanium oxide ($TiO_X$), hafnium oxide ($HfO_X$), zirconium oxide ($ZrO_X$), germanium oxide ($GeO_X$), cesium oxide ($CeO_X$).

Figure 8:
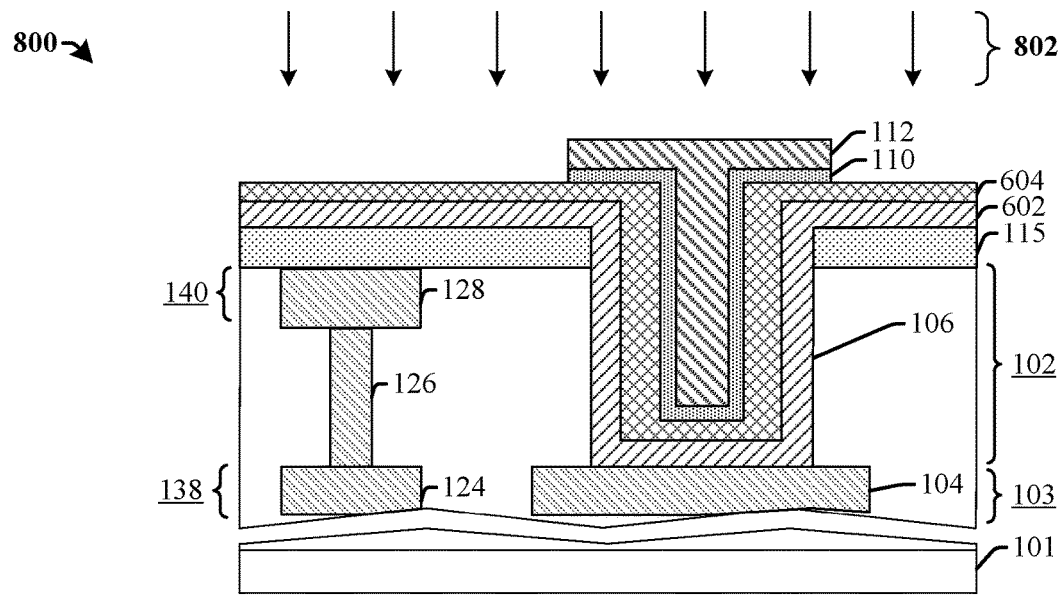

As shown in cross-sectional view 800 of FIG. 8, the top electrode layer and the capping layer are patterned to form a top electrode 112 over a capping layer 110. In some embodiments, a mask (not shown), such as a photoresist mask or SiN—, SiON—, or SiO2— hardmask are formed to cover some portions of the top electrode layer 704 while leaving other portions of the top electrode layer exposed. With the mask in place, the top electrode layer 704 and the capping layer 702 are selectively exposed to an etchant 802 in areas not covered by the mask. In some embodiments, the etchant 802 can comprise a dry etchant (e.g., a plasma etchant, a RIE etchant, etc.) or a wet etchant (e.g., comprising hydrofluoric acid (HF)).

Figure 9:
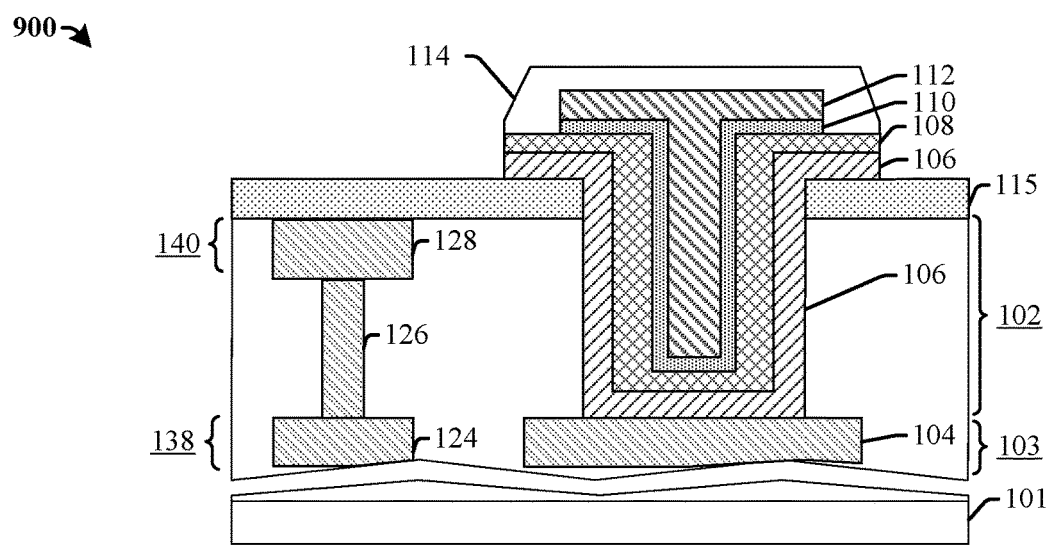

As shown in cross-sectional view 900 of FIG. 9, a sidewall spacer 114 is formed to cover sidewalls of the top electrode 112 and the capping layer 110. In some embodiments, the sidewall spacer 114 can be formed by depositing a conformal nitride over the entire upper surface of the structure and then etching back the nitride to form the sidewall spacer 114. A second patterning process is then performed to pattern a data storage layer 108 and a bottom electrode 106. In some other embodiments, the data storage layer 108 and bottom electrode 106 are patterned by an additional mask, such as a photoresist mask formed by photolithography. In some further embodiments, the bottom electrode 602 can be planarized before forming the top electrode layer 704, to leave an upper surface of the bottom electrode 602 aligned with that of the spacer layer 115. In this case, an isolation distance between the top electrode and the bottom electrode would be a distance from an edge of the top electrode to an edge of the deep trench, and the additional mask may not be needed.

Figure 10:
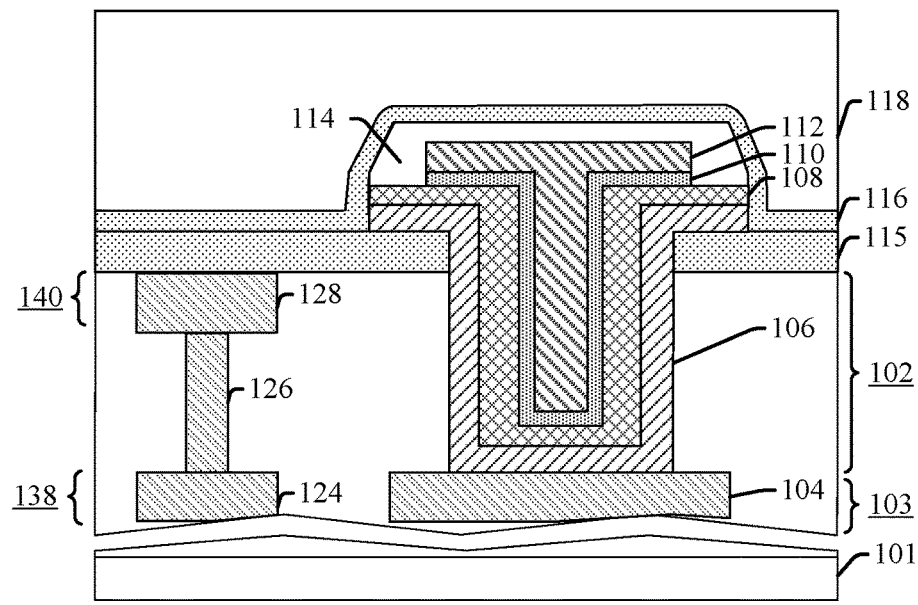

As shown in cross-sectional view 1000 of FIG. 10, an upper etch stop layer 116 is formed over the spacer layer 115. The upper etch stop layer 116 extends along sidewalls of the bottom electrode 106 and/or the data storage layer 108, and extends upwardly to cover the sidewall spacer 114. An upper ILD layer 118 is then formed over the upper etch stop layer 116.

Figure 11:
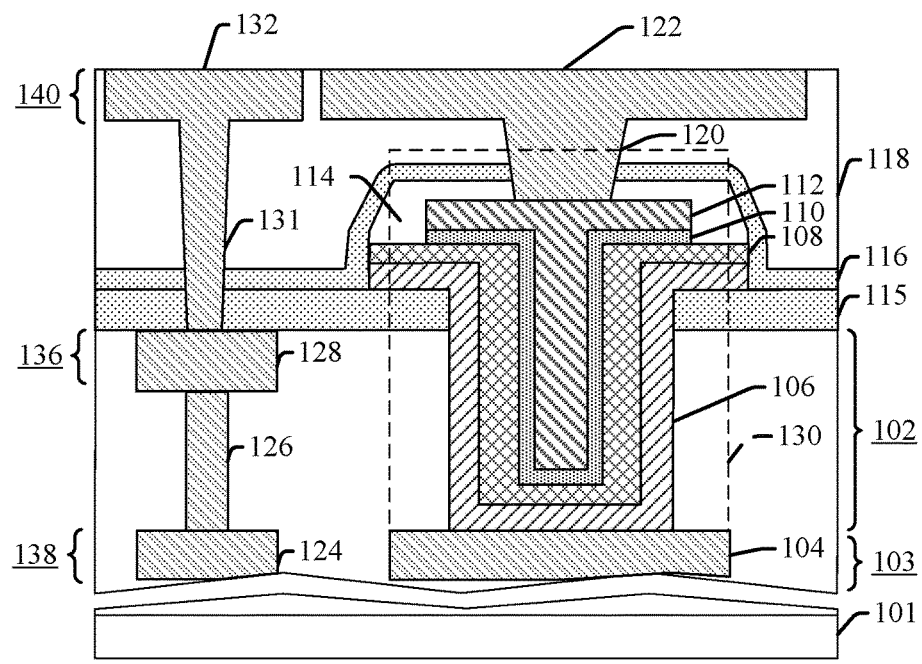

As shown in cross-sectional view 1100 of FIG. 11, an upper metal layer 140 is formed within the upper ILD layer 118. The upper ILD layer 118 and the upper etch stop layer 116 can be subsequently patterned to form a conductive via 120 that couples the top electrode 112 and an upper metal line 122 of the upper metal layer 140.

Figure 12:
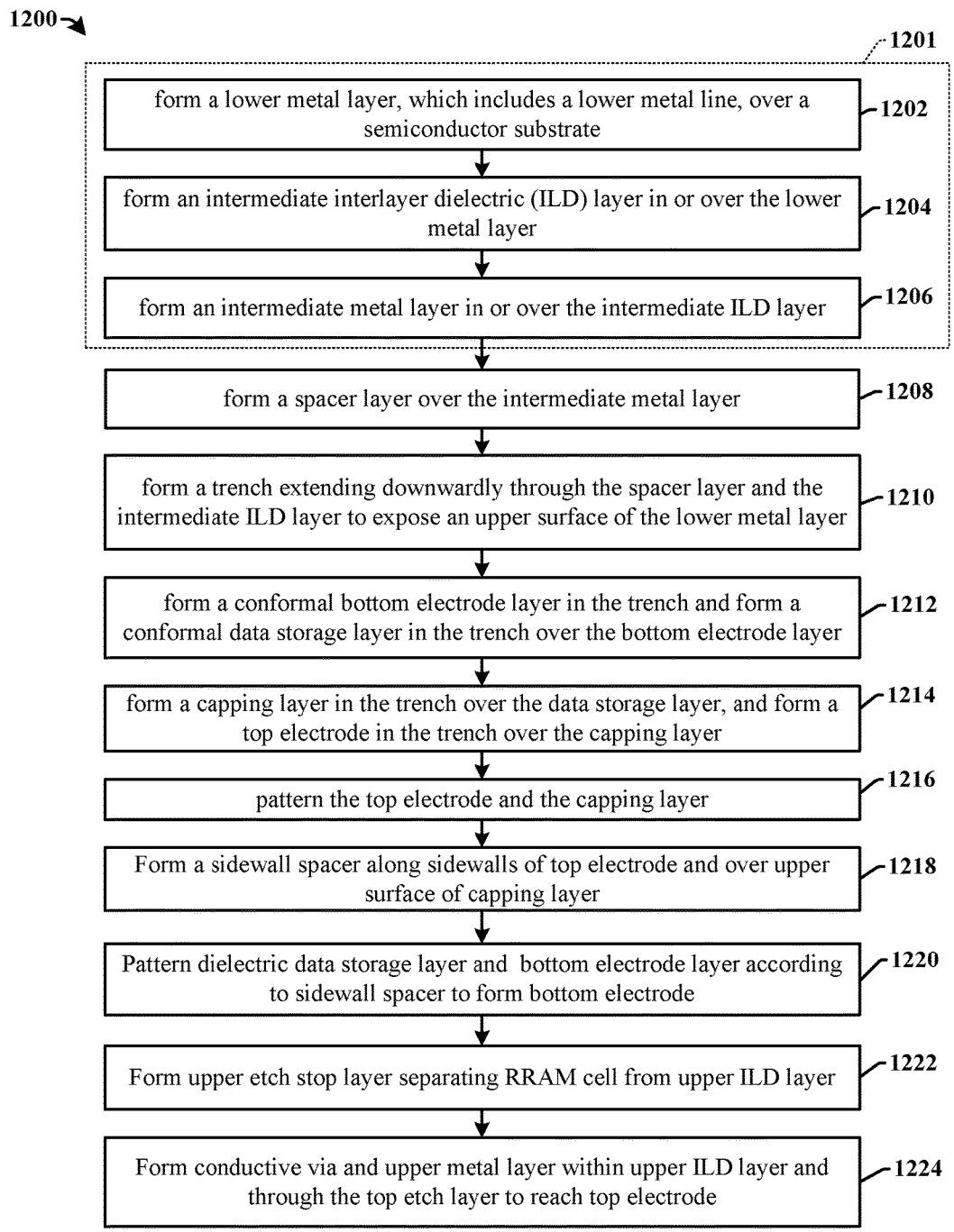
FIG. 12 illustrates a flow diagram of some embodiments of a method of forming an RRAM cell.

FIG. 12 illustrates a flow diagram of some embodiments of a method 1200 of forming an RRAM cell comprising a bottom electrode recessed into a deep trench of an ILD layer.

While the disclosed method 1200 is illustrated and described herein as a series of acts or events, it will be appreciated that the illustrated ordering of such acts or events are not to be interpreted in a limiting sense. For example, some acts can occur in different orders and/or concurrently with other acts or events apart from those illustrated and/or described herein. In addition, not all illustrated acts can be required to implement one or more aspects or embodiments of the description herein. Further, one or more of the acts depicted herein can be carried out in one or more separate acts and/or phases.

At 1201, an interconnect structure made up of at least two metal interconnect layers is formed. Thus, acts 1202-1206 can be used to form a structure just prior to the structure illustrated in FIG. 4, where a lower metal line 124 and intermediate metal line are formed.

At 1208, a spacer layer is formed over the intermediate metal layer. Thus, act 1208 can correspond to previous FIG. 4, for example.

At 1210, the spacer layer and lower ILD layer are etched to form a deep trench and expose an upper surface of lower metal line. The deep trench is formed into the lower ILD layer, vertically cross at least one metal layer and a via layer that connects two metal layers, and to reach a lower metal line at a lower position of the lower ILD layer. Thus, act 1210 can correspond to FIG. 5, for example.

At 1212, a conformal bottom electrode layer and a conformal data storage layer are formed within the deep trench and over the lower ILD layer. In some embodiments, the bottom electrode layer and/or the data storage layer are formed in conformal. The bottom electrode layer and the data storage layer are formed along sidewall and bottom surfaces of the deep trench and to leave a remaining spacer at a center position of the deep trench. Thus, act 1212 can correspond to FIG. 6, for example.

At 1214, a capping layer and a top electrode layer are formed over the data storage layer and fill the remaining space of the deep trench. Thus, act 1214 can correspond to FIG. 7, for example.

At 1216, the top electrode and capping layer are patterned. Thus, act 1216 can correspond to FIG. 8, for example.

At 1218, a sidewall spacer is formed along sidewalls of the top electrode and the capping layer. At 1220, the dielectric data storage layer and the bottom electrode layer are patterned according to the sidewall spacer to form the bottom electrode. Thus, acts 1218 and 1220 can correspond to FIG. 9, for example.

At 1222, an upper etch stop layer is formed, separating the RRAM cell from an upper ILD layer which is formed over the upper etch stop layer. Thus, act 1222 can correspond to FIG. 10 for example.

At 1224, a conductive via and an upper metal layer are formed within the upper ILD layer and through the top etch layer to contact the top electrode. Thus, act 1224 can correspond to FIG. 11, for example.

Some embodiments relate to an integrated circuit, which includes a semiconductor substrate and an interconnect structure disposed over the semiconductor substrate. The interconnect structure includes a lower metal layer, an intermediate metal layer disposed over the lower metal layer, and an upper metal layer disposed over the intermediate metal layer. An upper surface of the lower metal layer and a lower surface of the intermediate metal layer are spaced vertically apart by a first distance. A resistive random access memory (RRAM) cell is arranged between the lower metal layer and the upper metal layer. The RRAM cell includes a bottom electrode and a top electrode which are separated by a data storage layer having a variable resistance. The data storage layer vertically spans a second distance that is greater than the first distance.

In other embodiments, the present disclosure relates to an integrated circuit which includes a semiconductor substrate and an interconnect structure disposed over the semiconductor substrate. The interconnect structure comprises a lower metal layer, an intermediate metal layer separated from the lower metal layer by a lower ILD layer, and an upper metal layer separated from the intermediate metal layer by an upper ILD layer. A lower via extends through the lower ILD layer to couple a first metal line of the lower metal layer to a second metal line of the intermediate metal layer. An upper via extends through the upper ILD layer to couple the second metal line of the intermediate metal layer to a third metal line of the upper metal layer. A resistive random access memory (RRAM) cell is arranged between the lower metal layer and the upper metal layer. The RRAM cell includes a bottom electrode and a top electrode which are separated by a data storage layer having a variable resistance. The data storage layer vertically spans a distance that is greater than a height of the lower via or a height of the upper via.

In yet other embodiments, the present disclosure relates to a method of forming an RRAM cell. In this method, a lower metal layer, which includes a lower metal line, is formed over a semiconductor substrate. A lower intermediate layer dielectric (ILD) layer is formed over the lower metal layer. An intermediate metal layer is formed over the ILD layer. A spacer layer is formed over the metal layer. A trench is formed to extend downwardly through the spacer layer and the ILD layer to expose an upper surface of the lower metal layer. A conformal bottom electrode layer is formed over the exposed upper surface of the lower metal layer, along sidewalls of the trench, and at least partially over the spacer layer. A conformal data storage layer is formed in the trench along an upper surface of the bottom electrode layer. A top electrode is formed in the trench over the data storage layer.

The foregoing outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. An integrated circuit, comprising:
   a semiconductor substrate;
   an interconnect structure disposed over the semiconductor substrate, the interconnect structure including a first metal layer and a second metal layer disposed over the first metal layer, wherein an upper surface of the first metal layer and a lower surface of the second metal layer are spaced vertically apart by a first distance;
   a spacer layer disposed directly over the second metal layer; and
   a data storage layer arranged within the interconnect structure and separating a bottom electrode and a top electrode, the bottom electrode having a lower surface in direct contact with an upper surface of the first metal layer, and having an upper region that extends up and over the spacer layer, wherein the data storage layer vertically spans a second distance that is greater than the first distance.

2. The integrated circuit of claim 1, wherein the top electrode has a T-shaped cross-section, and the data storage layer has a U-shaped cross-section that matingly engages the T-shaped cross-section of the top electrode.

3. The integrated circuit of claim 1, wherein the top electrode has a top electrode width measured between outermost sidewalls of the top electrode and wherein the bottom electrode has a bottom electrode width measured between outermost sidewalls of the bottom electrode, the bottom electrode width being greater than the top electrode width.

4. The integrated circuit of claim 1, wherein the interconnect structure includes a third metal layer spaced above the first second metal layer, and wherein an upper surface of the data storage layer is spaced above an upper surface of the second metal layer and below a lower surface of the third metal layer.

5. The integrated circuit of claim 4, further comprising:
   a lower interlayer dielectric (ILD) layer separating the first metal layer from the second metal layer;
   an upper ILD layer separating the second metal layer from the third metal layer;
   a lower via extending through the lower ILD layer to couple a first metal line of the first metal layer to a second metal line of the second metal layer; and
   an upper via extending through the upper ILD layer to couple the second metal line of the second metal layer to a third metal line of the third metal layer, wherein the second distance is greater than a height of the lower via.

6. The integrated circuit of claim 4, further comprising:
   an upper etch stop layer disposed directly on the spacer layer and extending over an upper surface of the top electrode, wherein the bottom electrode extends downwardly through an opening in the spacer layer and the upper region of the bottom electrode is disposed in direct contact with an upper surface of the spacer layer.

7. The integrated circuit of claim 6, wherein the spacer layer and the upper etch stop layer are made of a same dielectric material as one another.

8. An integrated circuit, comprising:
   a semiconductor substrate;
   an interconnect structure disposed over the semiconductor substrate, the interconnect structure comprising: a first metal layer, a second metal layer, and a via coupling the first metal layer to the second metal layer; and
   a resistive random access memory (RRAM) cell arranged within the interconnect structure, the RRAM cell comprising:
   a top electrode and a bottom electrode, wherein the bottom electrode has a lower surface in direct contact with the first metal layer and an upper region that has a lateral portion disposed above the second metal layer; and
   a data storage layer separating the top and bottom electrode, the data storage layer having a variable resistance and vertically spanning a distance that is greater than a height of the via.

9. The integrated circuit of claim 8, wherein the top electrode has a top electrode width measured between outermost sidewalls of the top electrode and wherein the bottom electrode has a bottom electrode width measured between outermost sidewalls of the bottom electrode, the bottom electrode width being greater than the top electrode width.

10. The integrated circuit of claim 9, further comprising:
    a sidewall spacer disposed around sidewalls of the top electrode and over an upper surface of the bottom electrode, the sidewall spacer including a peripheral portion that spans a lateral distance as measured from an outermost sidewall of the top electrode to an outermost sidewall of the bottom electrode.

11. The integrated circuit of claim 10, wherein the sidewall spacer has a central portion extending over an upper surface of the top electrode.

12. The integrated circuit of claim 10, wherein the sidewall spacer has an upper surface aligned with that of the top electrode, such that the sidewall spacer does not extend over the top electrode.

13. The integrated circuit of claim 8, wherein the top electrode has a T-shaped cross-section that matingly engages a U-shaped cross-section of the data storage layer.

14. An integrated circuit, comprising:
    a semiconductor substrate;
    an interconnect structure disposed over the semiconductor substrate, the interconnect structure including a first metal layer and second metal layer disposed over the first metal layer;
    a resistive random access memory (RRAM) cell arranged within the interconnect structure, wherein the RRAM cell comprises:
    a bottom electrode having a lower portion in direct contact with the first metal layer and an upper portion extending above the second metal layer;
    a top electrode disposed over the bottom electrode and having a lower region that extends below the second metal layer; and
    a data storage layer separating the top and bottom electrodes, and having a bottom portion located at a first vertical height between an upper surface of the first metal layer and a lower surface of the second metal layer, and a top portion being located at a second vertical height above an upper surface of the second metal layer.

15. The integrated circuit of claim 14, wherein the interconnect structure includes a third metal layer disposed above the second metal layer, and wherein a lower surface of the third metal layer is located above the top portion of the data storage layer.

16. The integrated circuit of claim 15, further comprising:
    a lower interlayer dielectric (ILD) layer separating the first metal layer from the second metal layer;
    an upper ILD layer separating the second metal layer from the third metal layer;

a lower via extending through the lower ILD layer to couple a first metal line of the first metal layer to a second metal line of the second metal layer; and an upper via extending through the upper ILD layer to couple the second metal line of the second metal layer to a third metal line of the third metal layer.

17. The integrated circuit of claim 16, wherein outermost sidewalls of bottom electrode are spaced apart by a first width, and outermost sidewalls of the top electrode are spaced apart by a second width that is less than the first width.

18. The integrated circuit of claim 17, wherein the top electrode has an uppermost region that lies vertically between an upper surface of the second metal layer and a lower surface of the third metal layer.

19. The integrated circuit of claim 17, wherein the bottom electrode lies directly on an upper surface of the first metal layer.

20. The integrated circuit of claim 17, wherein the bottom electrode and the data storage layer each have a U-shaped cross-section, and wherein the data storage layer is disposed conformally over an upper surface of the bottom electrode.

\* \* \* \* \*